US010879151B2

(12) United States Patent
Parekh et al.

(10) Patent No.: US 10,879,151 B2
(45) Date of Patent: Dec. 29, 2020

(54) SEMICONDUCTOR PACKAGE WITH LIQUID METAL CONDUCTORS

(71) Applicant: TEXAS INSTRUMENTS INCORPORATED, Dallas, TX (US)

(72) Inventors: Dishit Paresh Parekh, Dallas, TX (US); Benjamin Stassen Cook, Addison, TX (US); Daniel Lee Revier, Dallas, TX (US); Jo Bito, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/235,419

(22) Filed: Dec. 28, 2018

(65) Prior Publication Data
US 2020/0211928 A1 Jul. 2, 2020

(51) Int. Cl.
| H01L 23/473 | (2006.01) |
| H01L 23/42 | (2006.01) |
| H01L 23/373 | (2006.01) |
| H01L 21/48 | (2006.01) |
| H01L 23/00 | (2006.01) |
| H01L 21/56 | (2006.01) |

(52) U.S. Cl.
CPC ........ H01L 23/473 (2013.01); H01L 21/4871 (2013.01); H01L 21/563 (2013.01); H01L 23/3736 (2013.01); H01L 23/42 (2013.01); H01L 24/28 (2013.01); H01L 24/48 (2013.01); H01L 2224/48227 (2013.01); H01L 2924/14 (2013.01)

(58) Field of Classification Search
CPC ... H01L 23/473; H01L 23/42; H01L 23/3736; H01L 21/4871; H01L 24/28; H01L 21/563; H01L 2924/14; H01L 2224/48227; H01L 23/373; H01L 21/48; H01L 23/00; H01L 21/56
USPC ........................................................ 257/678
See application file for complete search history.

(56) References Cited

U.S. PATENT DOCUMENTS

| 3,654,528 | A | * | 4/1972 | Barkan | ............... H01L 23/4006 257/714 |
| 4,251,852 | A | * | 2/1981 | Ecker | .................... H01L 23/055 174/535 |
| 4,579,167 | A | * | 4/1986 | Kuznetsov | .......... B22D 11/0611 164/429 |
| 4,635,705 | A | * | 1/1987 | Kuznetsov | .......... B22D 11/0611 164/429 |
| 5,882,989 | A | * | 3/1999 | Falster | ................ H01L 21/3225 438/473 |
| 6,110,823 | A | * | 8/2000 | Eldridge | .............. B23K 20/004 257/E21.503 |
| 6,600,651 | B1 | * | 7/2003 | Weng | .................... H01L 23/427 165/80.4 |

(Continued)

Primary Examiner — Alexander O Williams
(74) Attorney, Agent, or Firm — Michael A. Davis, Jr.; Charles A. Brill; Frank D. Cimino

(57) ABSTRACT

A semiconductor package includes a lead frame, a semiconductor device, a liquid metal conductor, and an encapsulation material. The semiconductor device is affixed to the lead frame. The liquid metal conductor couples the semiconductor device to the lead frame. The encapsulation material encases the semiconductor device, the liquid metal conductor, and at least a portion of the lead frame.

20 Claims, 12 Drawing Sheets

(56) References Cited

U.S. PATENT DOCUMENTS

| | | | |
|---|---|---|---|
| 7,670,879 B2* | 3/2010 | Fujimoto | H01L 23/49562 438/123 |
| 9,728,868 B1* | 8/2017 | Lostetter | H05K 1/181 |
| 9,872,390 B1* | 1/2018 | Holbery | H01L 23/5387 |
| 2004/0182088 A1* | 9/2004 | Ghoshal | H01L 23/552 62/3.7 |
| 2005/0160752 A1* | 7/2005 | Ghoshal | G06F 1/203 62/259.2 |
| 2009/0084435 A1* | 4/2009 | Guha | H01L 31/0521 136/255 |
| 2010/0065963 A1* | 3/2010 | Eldridge | B23K 20/004 257/734 |
| 2017/0170095 A1* | 6/2017 | Matsubara | H01L 23/295 |
| 2018/0110121 A1* | 4/2018 | Sugaya | H01L 23/49827 |
| 2018/0193544 A1* | 7/2018 | Pouchoulin | A61M 1/16 |
| 2019/0242690 A1* | 8/2019 | Hu | G01B 7/20 |
| 2019/0290396 A1* | 9/2019 | Yu | A61C 5/00 |
| 2020/0028115 A1* | 1/2020 | Yang | H01L 51/0097 |
| 2020/0083147 A1* | 3/2020 | Bito | H01L 23/49816 |

* cited by examiner

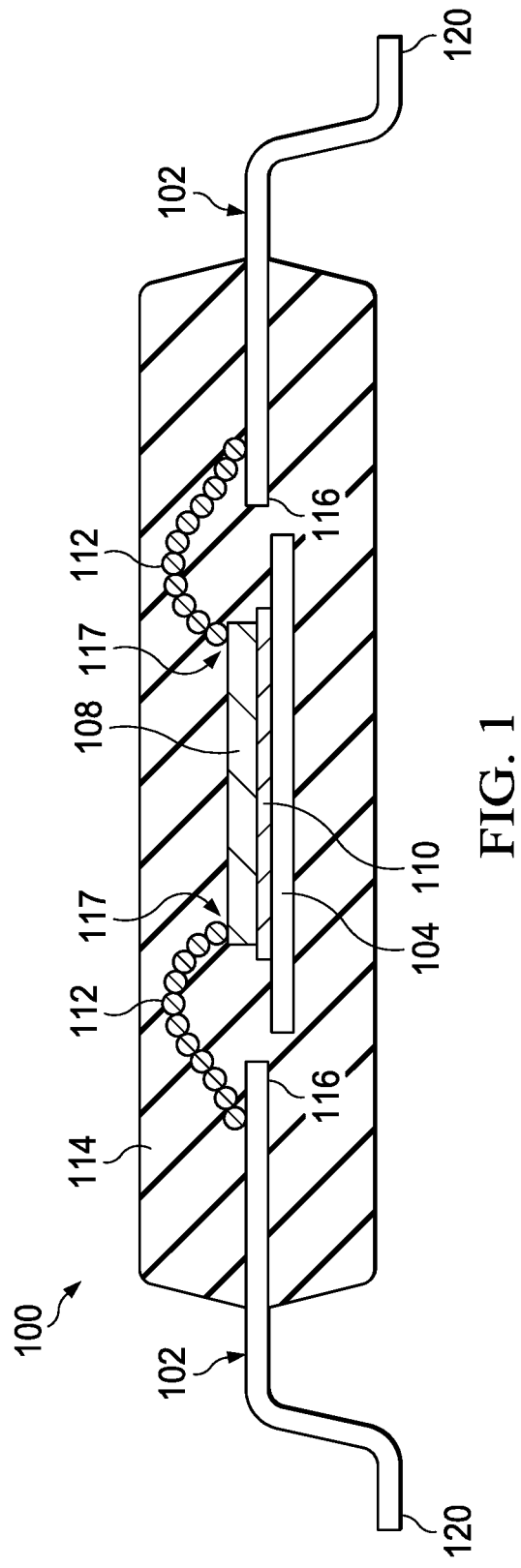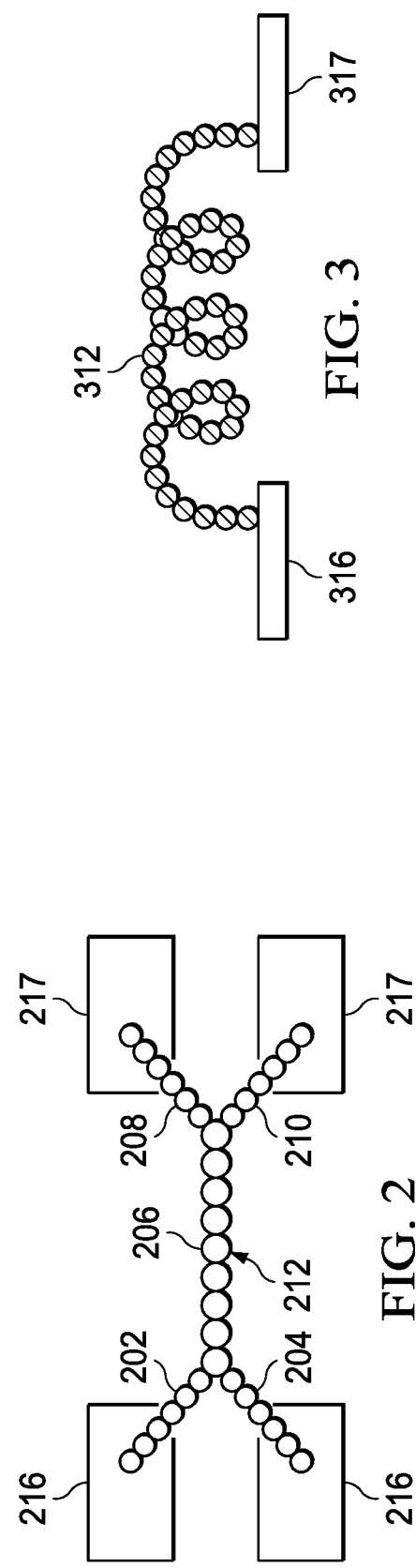

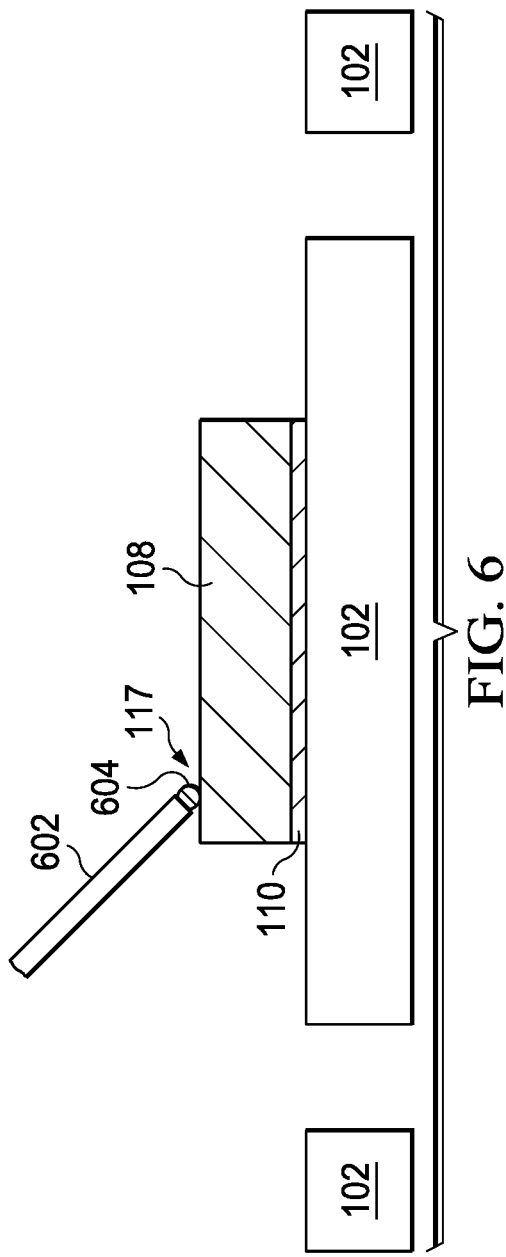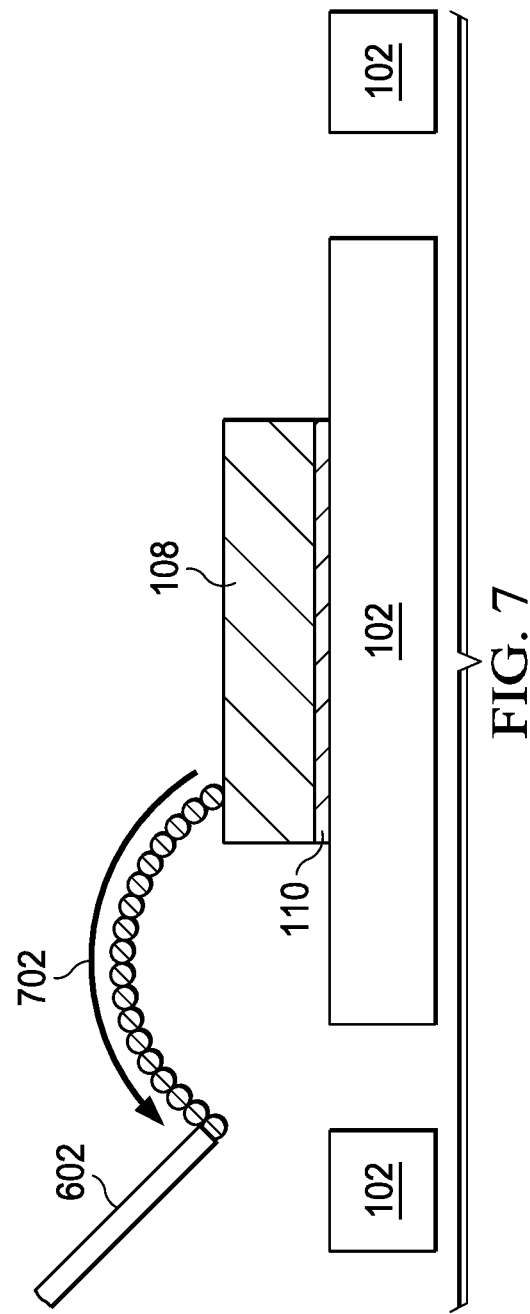

SEMICONDUCTOR PACKAGE WITH LIQUID METAL CONDUCTORS

BACKGROUND

Semiconductor devices, such as integrated circuits, are usually provided in packages that protect the semiconductor from hostile environments and enable electrical interconnection of the semiconductor device to other components of an electronic system, A packaged semiconductor device may include at least one integrated circuit die and a substrate or lead frame to which the die is affixed by an attachment medium such as solder or epoxy. In some packaging technologies, bond wires electrically connect the semiconductor device to terminals of the lead frame, and a protective mold compound, such as epoxy, covers the semiconductor device, the lead frame, and the bond wires to provide a protective case.

SUMMARY

A method for packaging a semiconductor using liquid metal conductors and semiconductor package that uses liquid metal interconnect are disclosed herein. In one example, a semiconductor package includes a lead frame, a semiconductor device, a liquid metal conductor, and an encapsulation material. The semiconductor device is affixed to the lead frame. The liquid metal conductor couples the semiconductor device to the lead frame. The encapsulation material encases the semiconductor device, the liquid metal conductor, and at least a portion of the lead frame.

In another example, a method for packaging a semiconductor includes forming a conductor between a semiconductor device and a lead frame. Forming the conductor includes at least dispensing a first portion of liquid metal, dispensing a second portion of the liquid metal, and dispensing a third portion of the liquid metal. The first portion of the liquid metal forms an electrically conductive connection with a conductive terminal of a semiconductor device. The second portion of the liquid metal forms an electrically conductive connection with a conductive terminal of a lead frame. The third portion of the liquid metal that forms a conductive track that is connected to the first portion of the liquid metal and to the second portion of the liquid metal. The method also includes encasing the semiconductor device, the conductor, and at least a portion of the lead frame in an encapsulation material.

In a further example, a semiconductor package includes a lead frame, a semiconductor device, a liquid metal heat sink, and an encapsulation material. The semiconductor device is affixed to the lead frame. The liquid metal heat sink is coupled to the lead frame and the semiconductor device, and is configured to transfer heat from the semiconductor device to the lead frame. The encapsulation material encases the semiconductor device, the liquid metal heat sink, and at least a portion of the lead frame.

BRIEF DESCRIPTION OF THE DRAWINGS

For a detailed description of various examples, reference will now be made to the accompanying drawings in which:

FIG. 1 shows an example packaged semiconductor device that includes liquid metal interconnections between the semiconductor device and the lead frame in accordance with this description;

FIG. 2 shows an example of a multipronged liquid metal interconnection in a packaged semiconductor device in accordance with this description;

FIG. 3 shows an example of a helical liquid metal interconnection in a packaged semiconductor device in accordance with this description;

FIGS. 5-9 show fabrication of a packaged semiconductor device in accordance with the method of FIG. 4;

DETAILED DESCRIPTION

Figure 4:
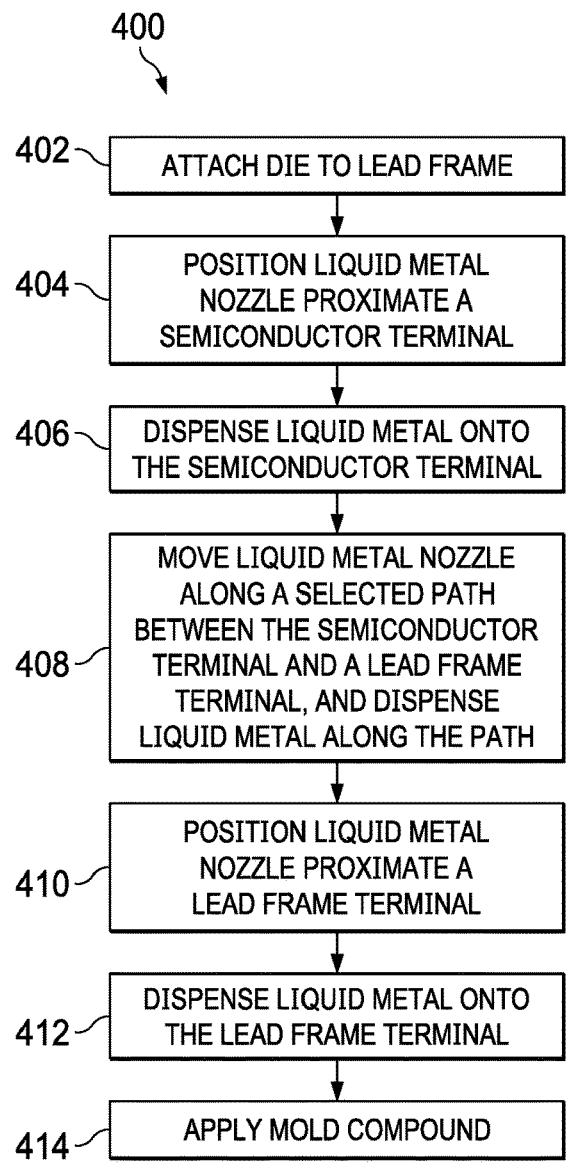
FIG. 4 shows a flow diagram for an example of a method for packaging a semiconductor device using liquid metal interconnections in accordance with this description.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In semiconductor packaging technologies that employ wire bonding to electrically connect a semiconductor device to a lead frame, the bond wires may be formed of aluminum, copper, silver, gold, conductive polymers, carbon nanotubes, or various other solid materials. While such materials provide good electrical conductivity in many applications, the maximum strain at which these materials provide satisfactory conductivity may be too low to enable reliable connections in applications that require package flexibility. The semiconductor packages and packaging methods disclosed herein employ bonding conductors that provide good conductivity at strain values higher than those at which solid materials can typically operate. Implementations of the semiconductor packages disclosed herein employ liquid metal conductors to electrically connect a semiconductor device to a lead frame. The liquid metal may be a eutectic alloy of gallium and indium in some implementations.

FIG. 1 shows an example of a packaged semiconductor 100 that includes liquid metal interconnections between a semiconductor device and a lead frame in accordance with this description. The packaged semiconductor 100 includes a lead frame 102, a semiconductor device 108, liquid metal conductors 112, and encapsulation material 114. The lead frame 102 is a metallic or laminated structure that includes terminals 116 for conductively connecting to the semiconductor device 108 and terminals 120 for conductively connecting the packaged semiconductor 100 to circuitry external to the packaged semiconductor 100. Implementations of the lead frame 102 may include as many terminals 116 and terminals 120 as needed to provide electrical connections to the semiconductor device 108 and to circuitry external to the packaged semiconductor 100. In some implementations, the lead frame 102 may be form a flexible material.

The semiconductor device 108 may be an integrated circuit die or another device formed as a block of semiconductor material. The semiconductor device 108 is bonded to the lead frame 102 by a conductive adhesive 110, such as solder, conductive epoxy, or other material suitable for attaching the semiconductor device 108 to a pad 104 of the lead frame 102.

In the packaged semiconductor 100, electrical connections between the semiconductor device 108 and the lead frame 102 are not made by solid bond wires (e.g., gold or palladium-coated-copper bond wires), but by liquid metal conductors 112. The liquid metal conductors 112 may include eutectic gallium-indium or other metal that is liquid at low temperature (e.g., liquid over the range of temperatures at which the packaged semiconductor 100 operates). The liquid metal conductors 112 electrically connect the terminals 116 of the lead frame 102 to the terminals 117 of the semiconductor device 108. The liquid metal conductors 112 allow the packaged semiconductor 100 to be deformed (e.g., bent, twisted, or stretched) while maintaining conductivity between the semiconductor device 108 and the lead frame 102.

The encapsulation material 114 encases the semiconductor device 108, the liquid metal conductors 112, and at least a portion of the lead frame 102. The encapsulation material 114 may be a flexible material that allows the shape of the packaged semiconductor 100 to be changed by external forces.

In the packaged semiconductor 100, the liquid metal conductors 112 are illustrated as being formed as an arc that extends from the terminal 116 to the terminal 117. However, in manufacture of the packaged semiconductor 100, the liquid metal conductors 112 may be constructed to form a variety of shapes and configurations. For example, the diameter of the liquid metal conductor 112, or a portion thereof, may be increased to provide reduced resistance. FIG. 2 shows an example of a multipronged liquid metal conductor 212 in a packaged semiconductor in accordance with this description. The multipronged liquid metal conductor 212 is an implementation of the liquid metal conductors 112. In FIG. 2, the multipronged liquid metal conductor 212 connects two terminals 216 of a lead frame to two terminals 217 of a semiconductor device. In some implementations, the multipronged liquid metal conductor 212 may connect two or more of the terminals 216 to one or more of the terminals 217 or may connect two or more of the terminals 217 to one or more of the terminals 216. The multipronged liquid metal conductor 212 includes a central portion 206 and branches 202 and 204 extending from the central portion 206 to connect the terminals 216 to the central portion 206. The multipronged liquid metal conductor 212 also includes branches 208 and 210 extending from the central portion 206 to connect the terminals 217 to the central portion 206. Implementations of the multipronged liquid metal conductor 212 may include as many branches as needed to connect to the terminals 216 or the terminals 217. The multipronged liquid metal conductor 212 may be constructed using various sequences of operations. In one implementation, construction of the multipronged liquid metal conductor 212 may include dispensing the liquid metal from a nozzle to form the branch 202, dispensing liquid metal from the nozzle to form the branch 204, dispensing liquid metal from the nozzle to form the central portion 206, dispensing liquid metal from a nozzle to form the branch 208, and dispensing liquid metal from the nozzle to form the branch 210. In the multipronged liquid metal conductor 212, or any liquid metal conductor 112, the diameter of the various segments of the conductor may vary. For example, in the multipronged liquid metal conductor 212, the diameter of the central portion 206 may be greater than the diameter of the branch 202, the branch 204, the branch 208, and/or the branch 210. Diameter of the segment of a liquid metal conductor may be determined by nozzle inner diameter or by diameter of a sphere of liquid metal dispensed. For example, dispensing a larger sphere of liquid metal from a nozzle produces a larger diameter liquid metal conductor.

FIG. 3 shows an example of a helical liquid metal conductor 312 that forms an inductor in a packaged semiconductor in accordance with this description. The helical liquid metal conductor 312 forms a coil between the terminal 316 of the lead frame and the terminal 317 of the semiconductor device. The helical liquid metal conductor 312 may be formed by moving a liquid metal nozzle between the terminal 316 and the terminal 317 in a helical path and dispensing liquid metal from the nozzle as the nozzle traverses the helical path.

FIG. 4 shows a flow diagram for an example of a method 400 for packaging a semiconductor device using liquid metal interconnections in accordance with this description. Though depicted sequentially as a matter of convenience, at least some of the actions shown can be performed in a different order and/or performed in parallel. Additionally, some implementations may perform only some of the actions shown.

Figure 5:
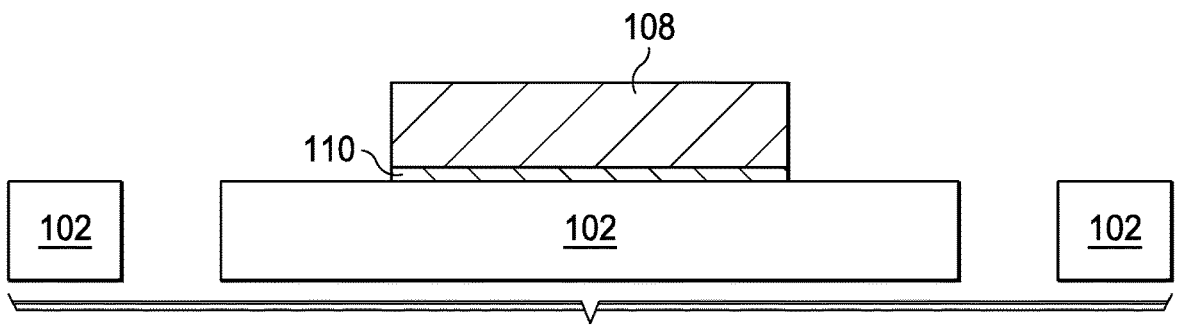

In block 402, a semiconductor device (e.g., the semiconductor device 108) is attached to a lead frame (e.g., the lead frame 102). For example, a conductive adhesive 110, such as solder or conductive epoxy, is applied to the pad 104 of the lead frame 102, and the semiconductor device 108 is disposed atop the conductive adhesive 110. The conductive adhesive 110 may be reflowed or cured as needed to secure the semiconductor device 108 to the lead frame 102. FIG. 5 shows the semiconductor device 108 bonded to the lead frame 102 by the conductive adhesive 110.

In block 404, the semiconductor device 108 has been bonded to the lead frame 102, and a liquid metal conductor 112 is to be dispensed to electrically connect the semiconductor device 108 to the lead frame 102. To form a liquid metal conductor 112, a liquid metal nozzle (e.g., the tip of a syringe needle), is positioned near a terminal (e.g., a terminal 117) of the semiconductor device 108 to be connected to the liquid metal conductors 112.

In block 406, liquid metal is dispensed from the nozzle and placed into contact with the terminal 117. The liquid metal dispensed from the nozzle may include an outer layer of oxide. In some implementations, physical interaction of the dispensed liquid metal with the terminal 117 ruptures the oxide layer to allow the liquid metal to contact the terminal 117. In some implementations, a cleaning agent, such as a flux may be dispensed onto the terminal 117 prior to the dispensing the liquid metal from the nozzle to remove the oxide layer from the dispensed liquid metal and facilitate an electrical connection between the liquid metal and the terminal 117. FIG. 6 shows a nozzle 602 disposed proximate the terminal 117, and a portion of liquid metal 604 dispensed from the nozzle 602 to form an electrical connection with the terminal 117.

In block 408, the nozzle 602 is moved along a path selected to form the liquid metal conductor 112. Liquid metal is dispensed from the nozzle 602 as the nozzle 602 is moved along the path. FIG. 7 shows the nozzle 602 moving along the path 702. As the nozzle 602 moves along the 702, the nozzle 602 dispenses liquid metal that physically and electrically connects to the previously dispensed liquid metal to form the liquid metal conductor 112 (e.g., dispensed spheres of liquid metal merge to form a continuous liquid metal track).

In block 410, the nozzle 602 is positioned near a terminal (e.g., a terminal 116) of the lead frame 102 to be connected to the liquid metal conductor 112 to dispense a portion of liquid metal that connects the liquid metal conductors 112 to the lead frame 102.

Figure 8:
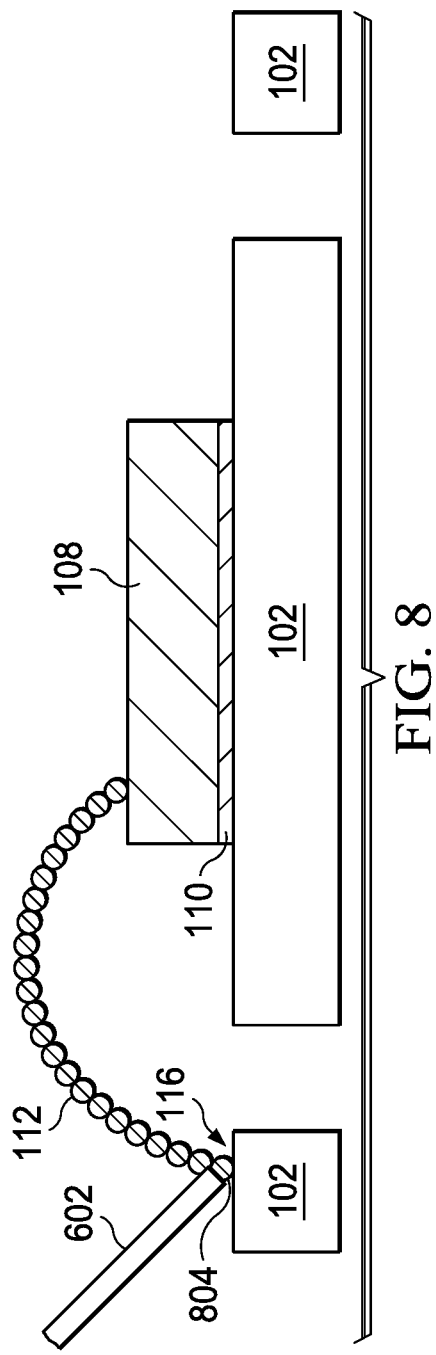

In block 412, liquid metal is dispensed from the nozzle 602 and placed into contact with the terminal 116 and the previously dispensed liquid metal of the liquid metal conductors 112. The liquid metal dispensed from the nozzle 602 may include an outer layer of oxide. In some implementations, physical interaction of the dispensed liquid metal with the terminal 116 ruptures the oxide layer to allow the liquid metal to contact the terminal 116. In some implementations, a cleaning agent, such as a flux may be dispensed onto the terminal 116 prior to the dispensing the liquid metal from the nozzle to remove the oxide layer from the liquid metal and facilitate an electrical connection between the liquid metal and the terminal 116. FIG. 8 shows the nozzle 602 disposed proximate the terminal 116, and a portion of liquid metal 804 dispensed from the nozzle 602 to form an electrical connection with the terminal 116.

Figure 9:
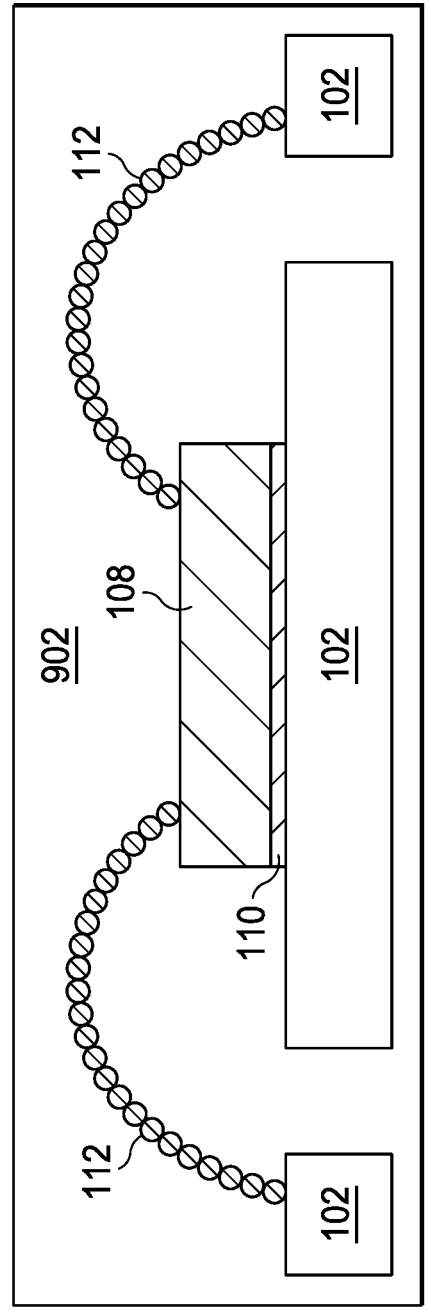

In block 414, an encapsulation material 114 is applied to the lead frame 102, the semiconductor device 108, and the liquid metal conductors 112 to form a protective covering. In some implementations, the encapsulation material 114 is flexible and/or stretchable. FIG. 9 shows the encapsulation material 114 surrounding the lead frame 102, the semiconductor device 108, and the liquid metal conductors 112.

Figure 10A:
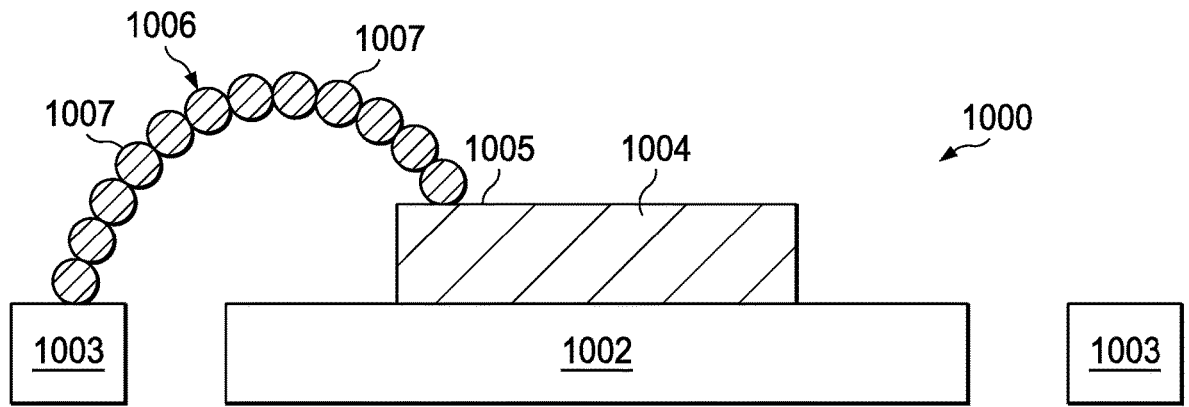
FIGS. 10A-10F show examples of various liquid metal conductor structures suitable for use in a packaged semiconductor device in accordance with this description.

FIGS. 10A-10F show examples of various liquid metal conductor structures suitable for use in a packaged semiconductor device in accordance with this description. In FIG. 10A, the packaged semiconductor device 1000 includes a semiconductor device 1004 coupled to a lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1006. The liquid metal conductor 1106 includes a plurality of merged spheres or balls of liquid metal 1007 that form a continuous liquid metal track. While this description illustrates various liquid metal conductors as formed from a series of connected spheres of liquid metal, the liquid metal conductors disclosed herein may be formed in a variety of structural configurations.

Figure 10B:
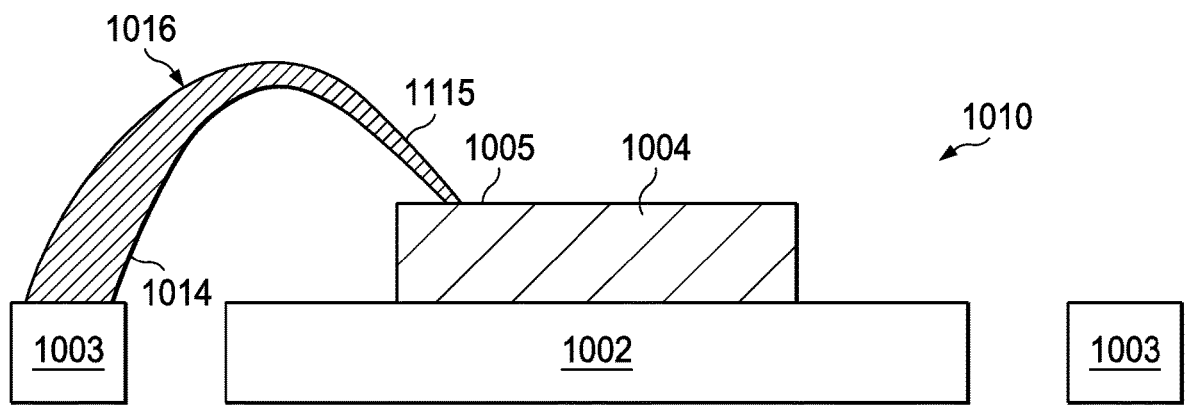

In FIG. 10B, the packaged semiconductor device 1010 includes a semiconductor device 1004 coupled to the lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1016. The liquid metal conductor 1016 includes a first end 1115 that is connected to the terminal 1005, and a second end 1014 that is connected to the terminal 1003. The diameter of the second end 1014 is greater than the diameter of the first end 1115. For example, the diameter of the liquid metal conductor 1016 increases with proximity to the 1003. Thus, the diameter of a liquid metal conductor may vary over the length of the liquid metal conductor.

Figure 10C:
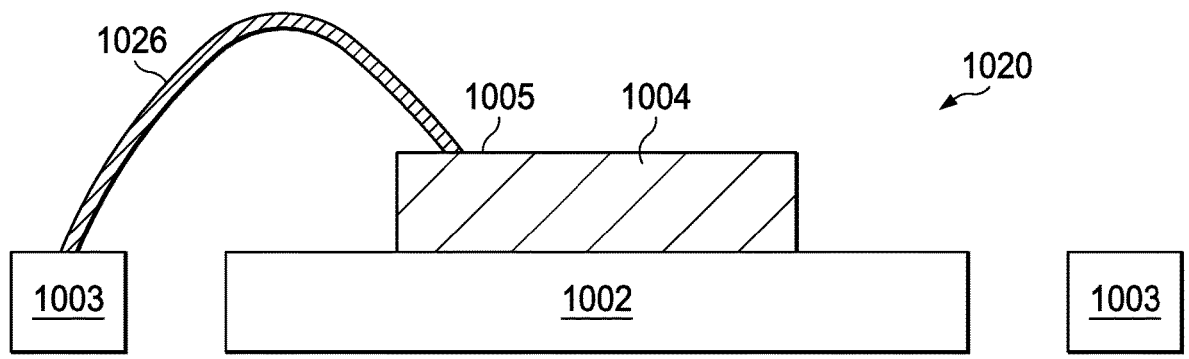

In FIG. 10C, the packaged semiconductor device 1020 includes a semiconductor device 1004 coupled to a lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1026. The diameter of the liquid metal conductor 1026 is uniform over the length of the liquid metal conductor 1026.

Figure 10D:
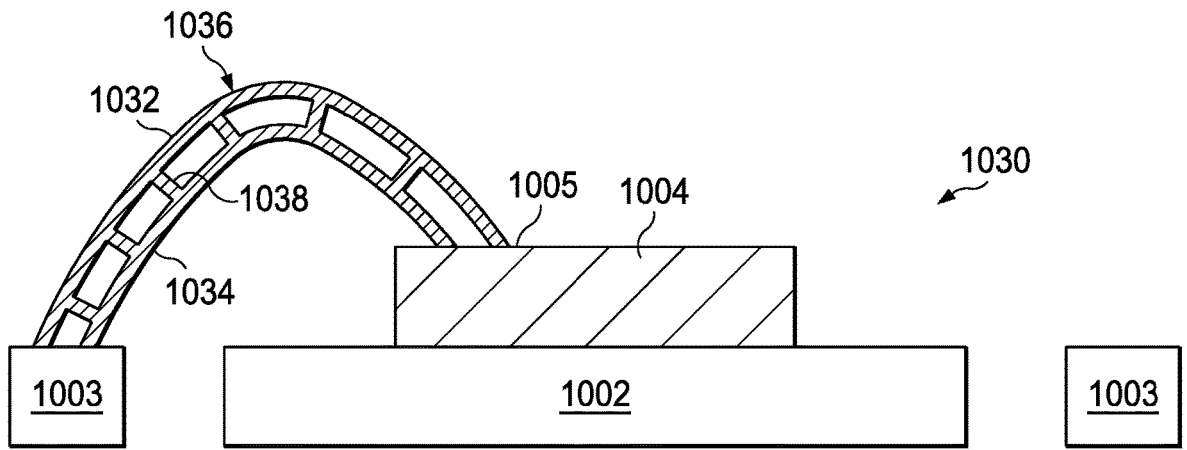

In FIG. 10D, the packaged semiconductor device 1030 includes a semiconductor device 1004 coupled to a lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1036. The liquid metal conductor 1036 includes a first liquid metal conductor 1032 and a second liquid metal conductor 1034 disposed in parallel and connected by a plurality of liquid metal conductors 1038. Thus, the liquid metal conductor 1036 is generally ladder-like in structure. In some implementations, the liquid metal conductor 1032 and the liquid metal conductor 1034 may be mechanically connected to different/multiple instances of the terminal 1005 and/or to different/multiple instances of the terminal 1003.

Figure 10E:
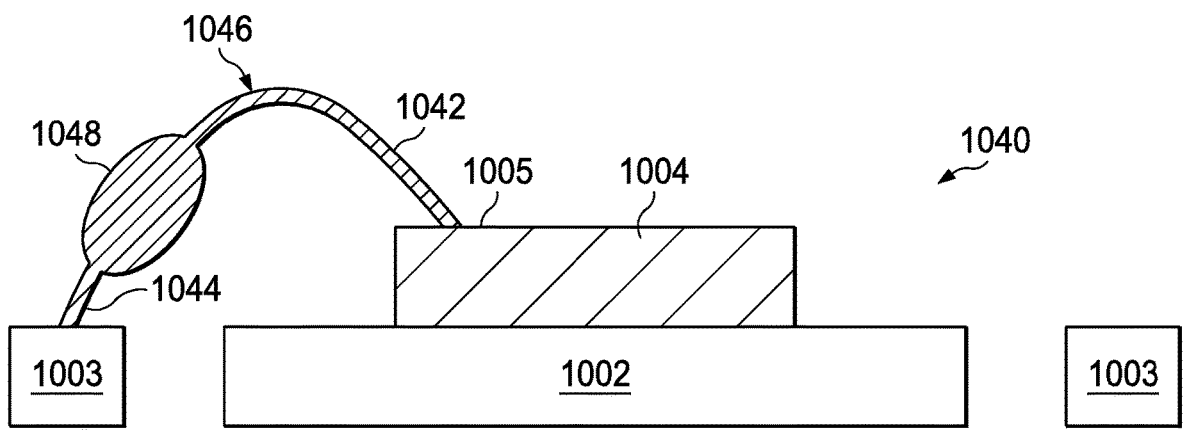

In FIG. 10E, the packaged semiconductor device 1040 includes a semiconductor device 1004 coupled to a lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1046. The liquid metal conductor 1046 include a first segment 1042, a second segment 1044, and a third segment 1048. The third segment 1048 couples the first segment 1042 to the second segment 1044. The diameter of the third segment 1048 is greater than the diameter of the first segment 1042 and the second segment 1044.

Figure 10F:
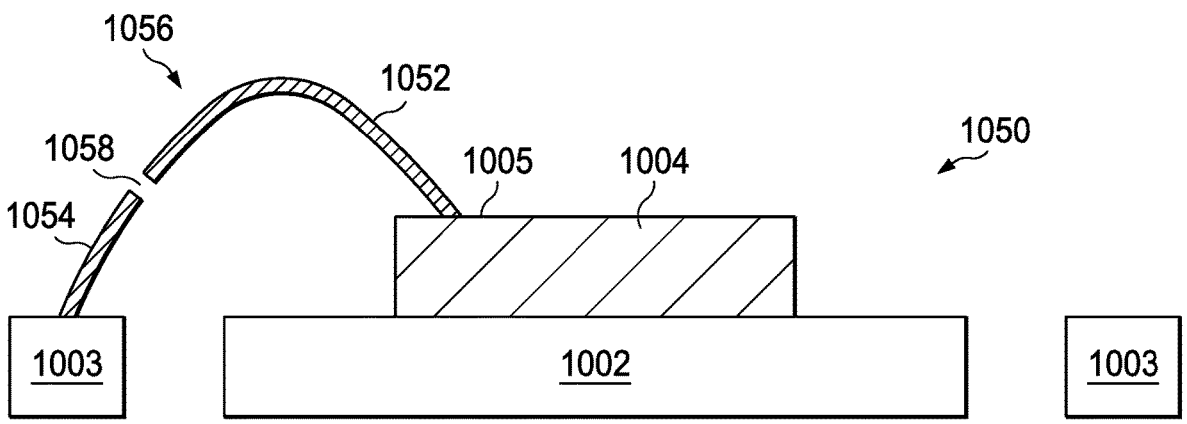

In FIG. 10F, the packaged semiconductor device 1050 includes a semiconductor device 1004 coupled to a lead frame 1002 by an attachment medium, such as a conductive adhesive or a layer of liquid metal. The semiconductor device 1004 includes a terminal 1005, and the lead frame 1002 includes a terminal 1003. The terminal 1005 is connected to the terminal 1003 by the liquid metal conductor 1056. The liquid metal conductor 1056 includes a first segment 1052 and a second segment 1054 separated by a gap 1058. The gap 1058 and any material disposed in the gap 1058 (e.g., mold compound or other encapsulation material) blocks the flow of direct current between the first segment 1052 and the second segment 1054, and allows the flow of alternating current between the first segment 1052 and the segment 1054. Thus, the liquid metal conductor 1056 capacitively couples the terminal 1003 of the lead frame 1002 to the terminal 1005 of the semiconductor device 1004.

Figure 11:
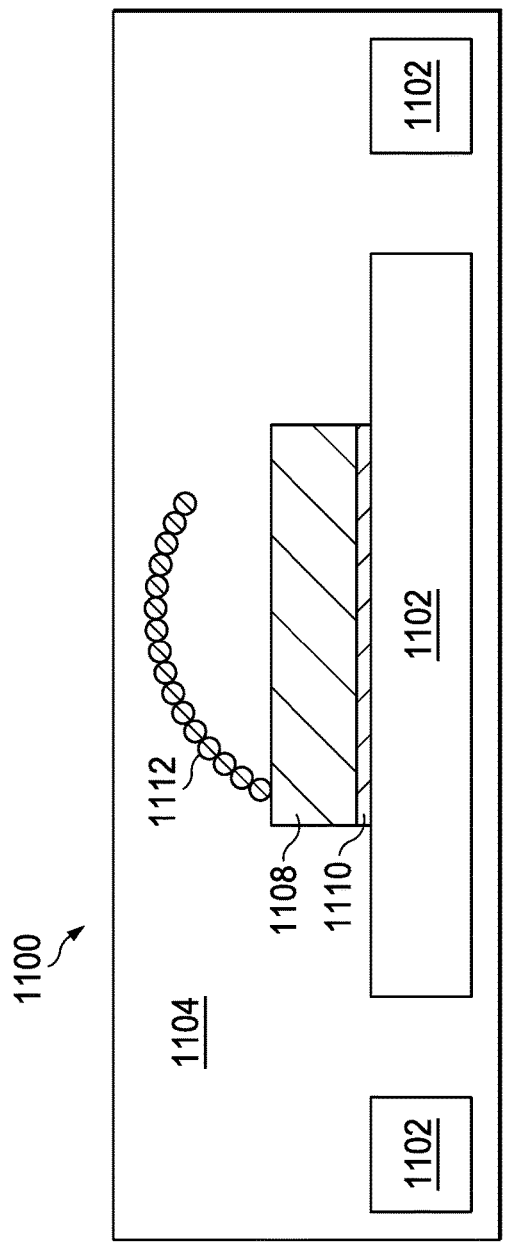
FIG. 11 shows an example of a packaged semiconductor device that includes a liquid metal conductor connected to the semiconductor device and not to the lead frame in accordance with this description.

Implementations of a packaged integrated circuit may include a variety of additional liquid metal structures either alone or in conjunction with liquid metal conductors connecting a die to a lead frame as described herein. FIG. 11 shows an example of a packaged semiconductor device 1100 that includes a liquid metal conductor 1112 connected to the semiconductor device 1108 and not to the lead frame 1102 in accordance with this description. The liquid metal conductor 1112 may operate as an antenna in some implementations of the 1100 and may be formed in a variety of shapes. The semiconductor device 1108 is coupled to the lead frame 1102 by an attachment medium 1110. The attachment medium 1110 may be a conductive adhesive. In some implementations the attachment medium 1110 may be liquid metal. The semiconductor device 1108 floats on the liquid metal, which provides electrical conductivity and stress isolation. The semiconductor device 1108, the liquid metal conductor 1112, and at least a portion of the lead frame 1102 are encased in an encapsulation material 1104. The conductor 1112 may be formed using a process similar that described in the method 400.

Figure 12:
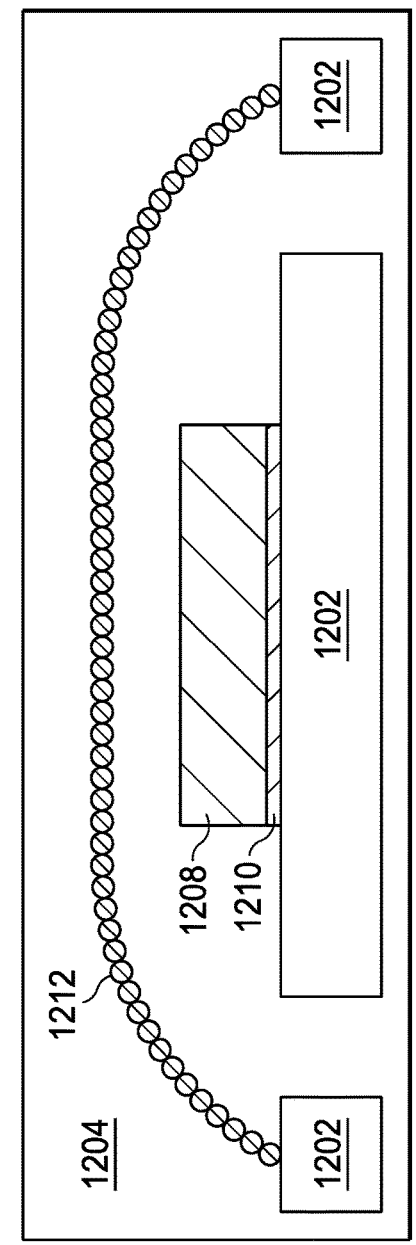
FIG. 12 shows an example of a packaged semiconductor device that includes a liquid metal conductor connected to the lead frame and not to the semiconductor device in accordance with this description.

FIG. 12 shows an example of a packaged semiconductor device 1208 that includes a liquid metal conductor 1212 connected to the lead frame 1202 and not to the semiconductor device 1208 in accordance with this description. The liquid metal conductor 1212 may operate as a shield in some implementations of the 1200 (e.g., to shield the semiconductor device 1208 from electromagnetic signals) and may be formed in a variety of shapes (e.g., a grid or mesh). The semiconductor device 1208 is coupled to the lead frame 1202 by an attachment medium 1210. The attachment medium 1210 may be a conductive adhesive. In some implementations the attachment medium 1210 may be liquid metal. The semiconductor device 1208 floats on the liquid metal, which provides electrical conductivity and stress isolation. The semiconductor device 1208, the liquid metal conductor 1212, and at least a portion of the lead frame 1202 are encased in an encapsulation material 1204. The conductor 1212 may be formed using a process similar that described in the method 400.

Figure 13:
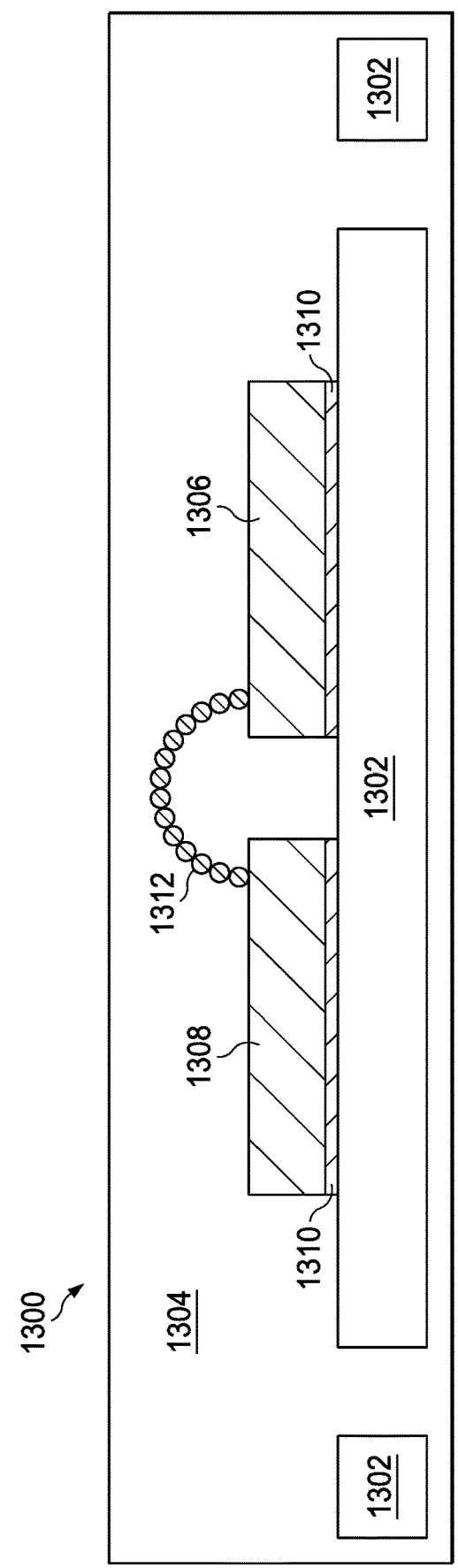
FIG. 13 shows an example of a liquid metal conductor that connects to semiconductor devices in a multi-device semiconductor package in accordance with this description.

FIG. 13 shows an example of a liquid metal conductor 1312 that connects two semiconductor devices in a multi-device semiconductor package 1300 in accordance with this description. The multi-device semiconductor package 1300 includes a lead frame 1302, a semiconductor device 1306, and a semiconductor device 1308. The semiconductor device 1306 and the semiconductor device 1308 are coupled to the lead frame 1302 by an attachment medium 1310. The attachment medium 1310 may be a conductive adhesive. In some implementations the attachment medium 1310 may be liquid metal. The semiconductor devices 1306 and 1308 float on the liquid metal, which provides electrical conductivity and stress isolation. The liquid metal conductor 1312 provides an electrical connection between the semiconductor device 1306 and the semiconductor device 1308. For example, a first end of the liquid metal conductor 1312 may connect to a conductive terminal of the semiconductor device 1306, and second end of the liquid metal conductor 1312 may connect to a conductive terminal of the semiconductor device 1308. Implementations of the 1300 may include as many liquid metal conductors 1312 as needed to electrically couple the semiconductor device 1306 and the semiconductor device 1308. The semiconductor device 1306, the semiconductor device 1308, the liquid metal conductor 1312, and at least a portion of the lead frame 1302 are encased in an encapsulation material 1304. The conductor 1312 may be formed using a process similar that described in the method 400.

Figure 14:
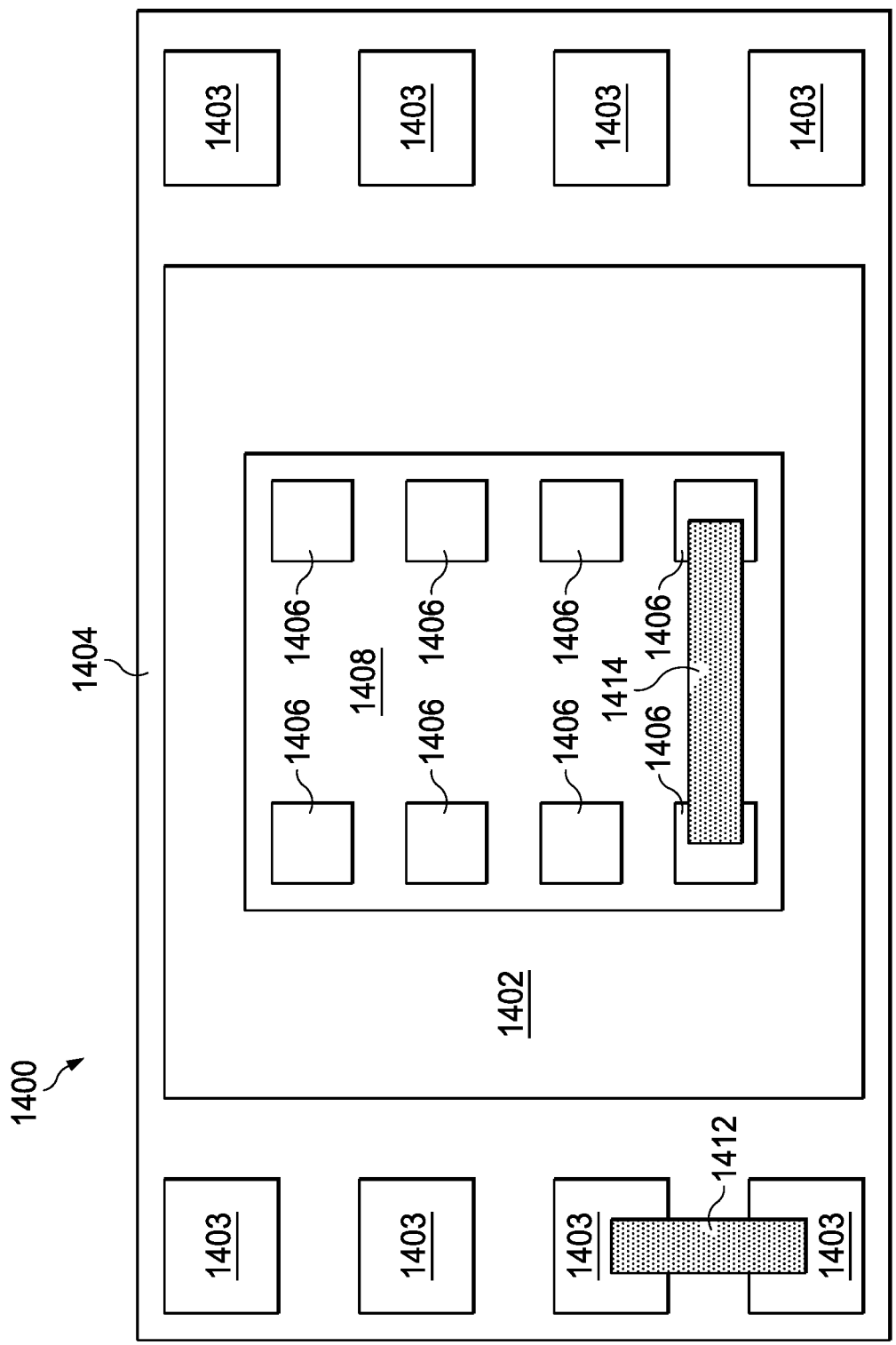
FIG. 14 shows an example of a liquid metal conductor that connects terminals of a lead frame, and/or a liquid metal conductor that connects terminal of a semiconductor device in accordance with this description.

FIG. 14 shows an example of a packaged semiconductor device 1400 that includes a liquid metal conductor 1412 that connects terminals 1403 of a lead frame 1402, and/or a liquid metal conductor 1414 that connects terminal 1406 of a semiconductor device 1408 in accordance with this description. The semiconductor device 1408 includes conductive terminals 1406. The liquid metal conductor 1414 connects two or more of the conductive terminals 1406. The lead frame 1402 includes conductive terminals 1403. The liquid metal conductor 1412 connects two or more of the conductive terminals 1403. In some implementations, the liquid metal conductor 1412 may be helical in shape to form an inductor between two conductive terminals 1403. The conductor 1412 and the conductor 1414 may be formed using a process similar that described in the method 400.

Figure 15:
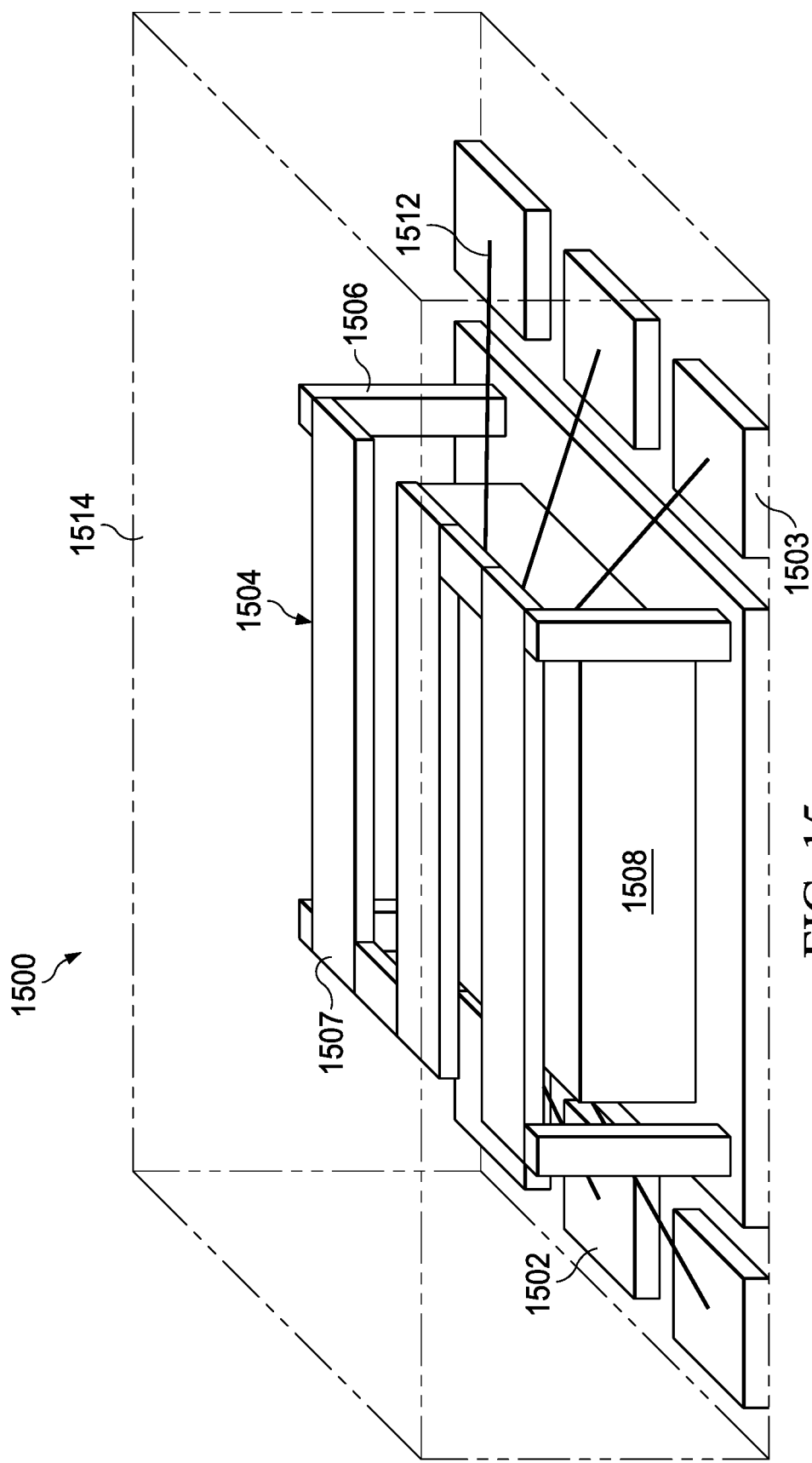
FIG. 15 shows an example of a packaged semiconductor device that includes a liquid metal heat sink in accordance with this description.

FIG. 15 shows an example of a packaged semiconductor device 1500 that includes a liquid metal heat sink 1504 in accordance with this description. The packaged semiconductor device 1500 includes a lead frame 1502 and a semiconductor device 1508. The semiconductor device 1508 is coupled to the lead frame 1502 by a conductive adhesive, such as conductive epoxy or solder, or by a layer of liquid metal. The lead frame 1502 includes terminals 1503. Conductors 1512, which may be bond wires, liquid metal conductors, or other conductive elements, electrically connect signal input/output terminals of the semiconductor device 1508 to the terminals 1503 of the lead frame 1502.

To aid in removal of heat from the semiconductor device 1502, the packaged semiconductor device 1500 includes the liquid metal heat sink 1504. The liquid metal heat sink 1504 is coupled to the semiconductor device 1508 and to the lead frame 1502 to conduct heat from the semiconductor device 1508 to the lead frame 1502. The liquid metal heat sink 1504 includes columns 1506 and beams 1507. The columns 1506 connect the liquid metal heat sink 1504 to the lead frame 1502. The beams 1507 are connected to the columns 1506 for conducting heat from the semiconductor device 1508 to the columns 1506 and ultimately to the lead frame 1502. The liquid metal heat sink 1504 may be in contact with the semiconductor device 1508 or heat may be conducted from the semiconductor device 1508 to the liquid metal heat sink 1504 through the protective case 1514 or other material that is coupled to the semiconductor device 1508 and the liquid metal heat sink 1504.

In some implementations, the liquid metal heat sink 1504 is constructed using a three-dimensional (3D) printing process (i.e., an additive manufacturing process) that builds up the columns 1506 and the beams 1507 by adding successive layers of liquid metal. After fabrication of the liquid metal heat sink 1504 is complete, the semiconductor device 1508, the conductors 1512, the liquid metal heat sink 1504, and at least a portion of the lead frame 1502 are encased in an encapsulation material, such as a mold compound that may be flexible and/or stretchable. The encapsulation material may be deployed using a 3D printing process that builds up the protective case 1514 in layers, or the encapsulation material may be flowed in a mold.

In some implementations, the protective case 1514 is deposited prior to formation of the liquid metal heat sink 1504. In such implementations, the protective case 1514 is deposited layer-by-layer using a 3D printing process. The 3D printed protective case 1514 includes microfluidic channels in the shapes of the columns 1506 and beams 1508 of the liquid metal heat sink 1504. After the protective case

1514, or at least a portion thereof, is in place, the microfluidic channels are filled with liquid metal to form the liquid metal heat sink 1504. For example, liquid metal may be drawn into the microfluidic channels by a vacuum applied to the channels, or liquid metal may be injected into the channels.

Figure 16A:
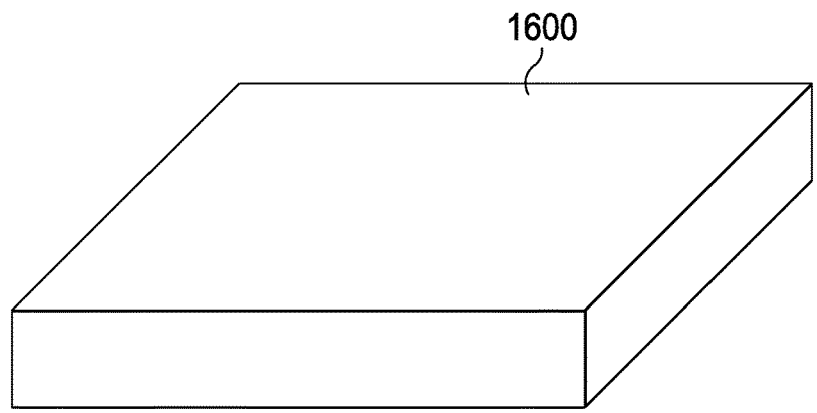
FIGS. 16A, 16B, and 16C show a semiconductor device that is connected to a lead frame by liquid metal bumps in accordance with this description.
Figure 16B:
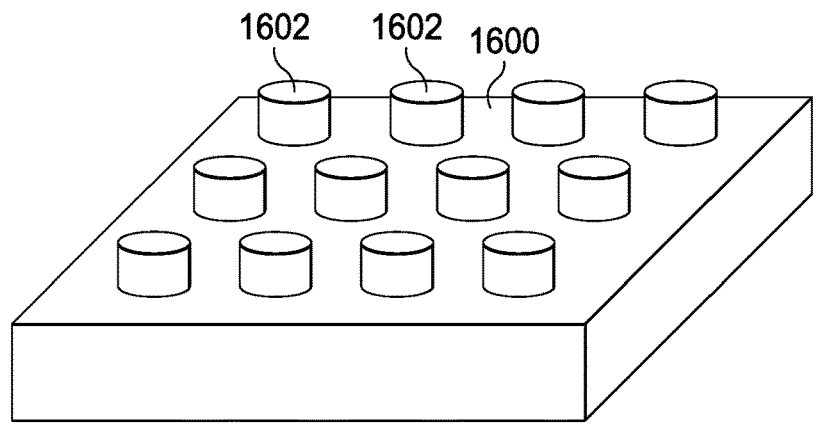
Figure 16C:
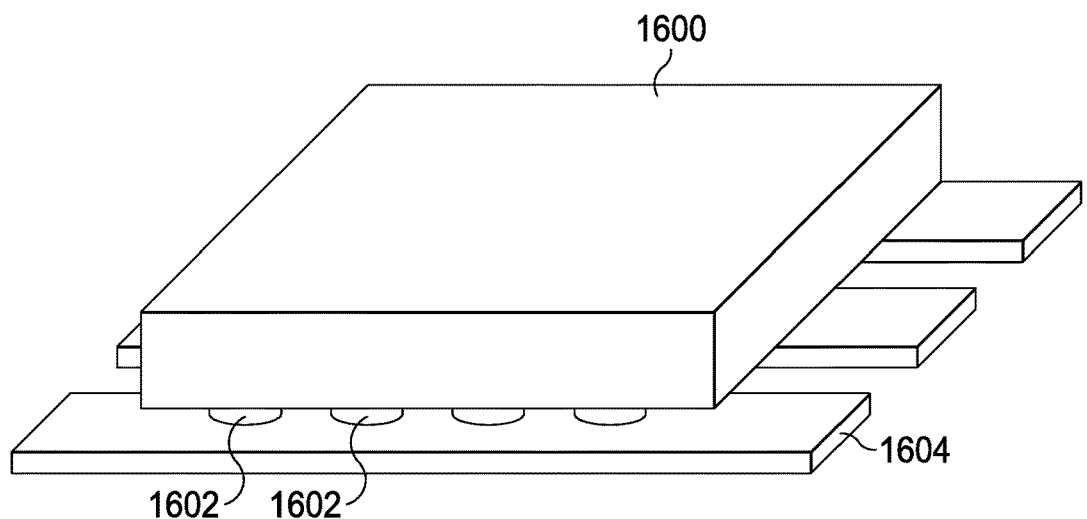

In flip-chip packaging, electromigration can damage the bumps that connect a semiconductor device to a lead frame. Differences in the coefficients of thermal expansion of the semiconductor device, the lead frame, the mold compound, etc. can damage the bumps or the connections between the bumps and the lead frame or semiconductor device. Some implementations of a packaged semiconductor device use liquid metal bumps. The liquid metal bumps are liquid at relatively low temperatures, which reduces the mechanical stress between the semiconductor device and the mold compound, the lead frame, etc. Moreover, the liquid metal allows self-healing of the bumps. FIGS. 16A, 16B, and 16C show a semiconductor device 1600 that is connected to a lead frame 1604 by liquid metal bumps 1602. In FIG. 16A, the semiconductor device 1600 is shown prior to the addition of bumps. In FIG. 16B, the liquid metal is added to the semiconductor device 1600 using a 3D printing processes to form the liquid metal bumps 1602. As many liquid metal bumps 1602 as are needed may be added to the semiconductor device 1600 by 3D printing. In FIG. 16C, the semiconductor device 1600 is coupled to a lead frame 1604. The lead frame 1604 may be metallic or include a substrate formed of one or more layers of conductors and insulating material. The liquid metal bumps 1602 make contact with the lead frame 1604 to electrically connect the semiconductor device 1600 to the lead frame 1604. An encapsulation material (e.g., a molding compound) may be applied to encase the semiconductor device 1600, the liquid metal bumps 1602, and/or the lead frame 1604.

Figure 17A:
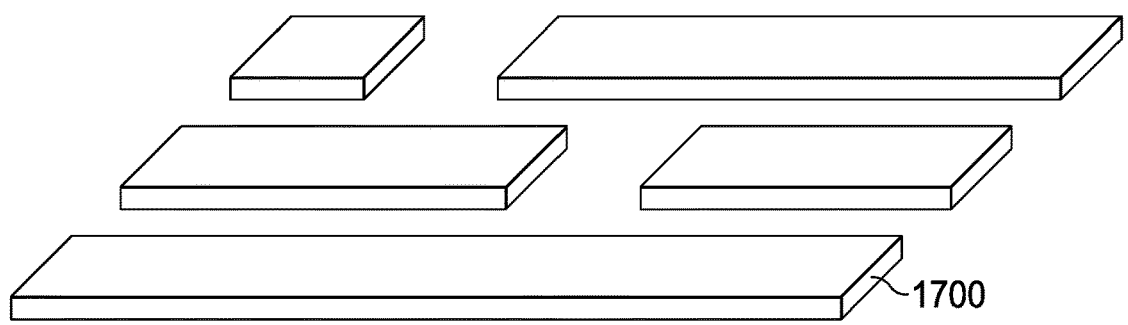
FIGS. 17A, 17B, and 17C show a semiconductor device that is connected to a lead frame by liquid metal bumps in accordance with this description.
Figure 17B:
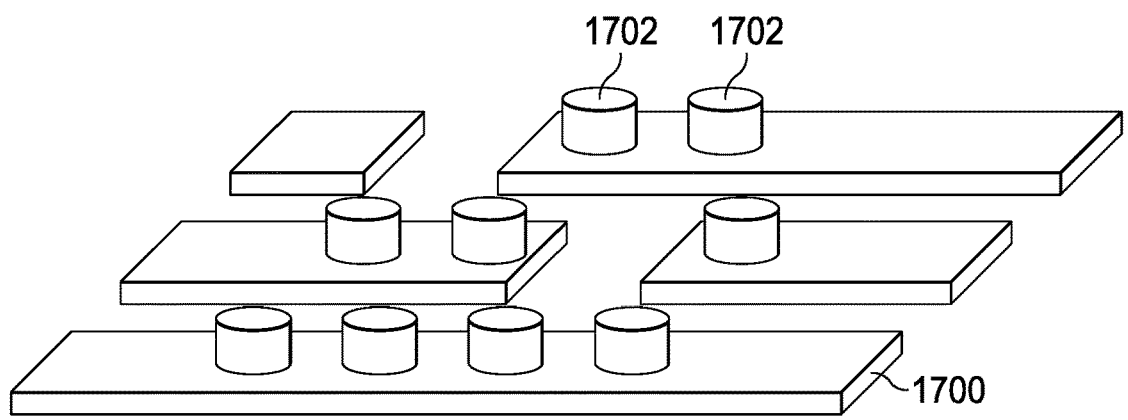
Figure 17C:
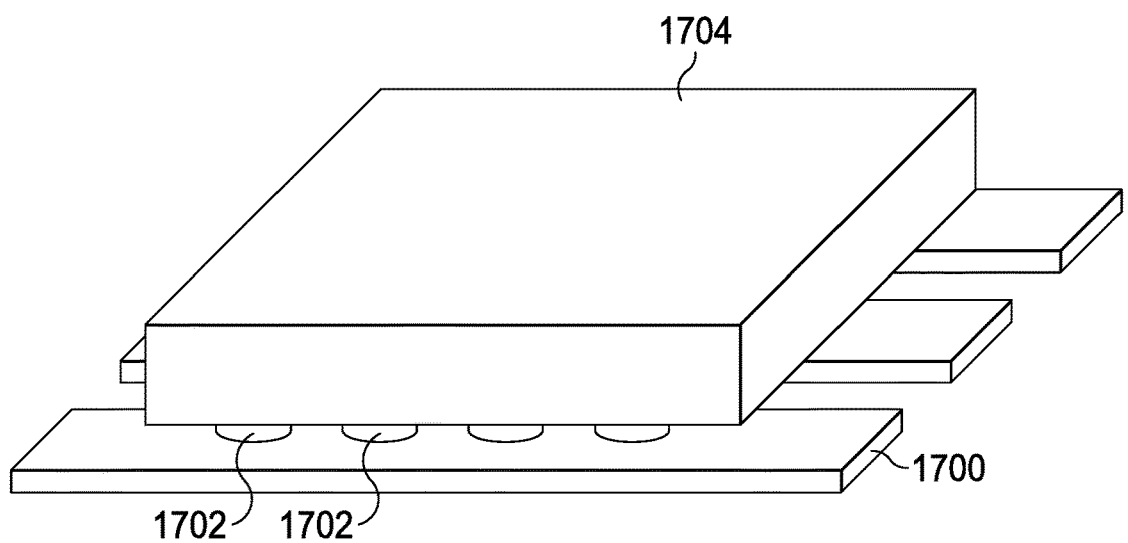

FIGS. 17A, 17B, and 17C show a semiconductor device 1704 that is connected to a lead frame 1700 by liquid metal bumps 1702. In FIG. 17A, the lead frame 1700 is shown prior to the addition of bumps. The lead frame 1700 may be metallic or include a substrate formed of one or more layers of conductors and insulating material. In FIG. 17B, the liquid metal is added to the lead frame 1700 using a 3D printing processes to form the liquid metal bumps 1702. As many liquid metal bumps 1702 as are needed may be added to the lead frame 1700 by 3D printing. In FIG. 16C, the semiconductor device 1704 is coupled to the lead frame 1700. The liquid metal bumps 1702 make contact with terminals of the semiconductor device 1704 to electrically connect the semiconductor device 1704 to the lead frame 1700. An encapsulation material (e.g., a molding compound) may be applied to encase the semiconductor device 1704, the liquid metal bumps 1702, and/or the lead frame 1700.

Implementations of a packaged semiconductor device in accordance with this description may include any combination of the various features disclosed herein. For example, an implementation of a packaged semiconductor device may include liquid metal conductors that electrically couple the semiconductor device and a lead frame, and/or a liquid metal conductor that is connected to the lead frame and not connected to the semiconductor device, and/or a liquid metal conductor that is connected to the semiconductor device and not connected to the lead frame, and/or liquid metal conductors that electrically couple two semiconductor devices, and/or a liquid metal conductor that electrically connects two terminals of a lead frame, and/or a liquid metal conductor that electrically connects two terminals of a semiconductor device, and/or a layer of liquid metal that couples a semiconductor device to a lead frame, and/or a liquid metal heat sink. Additionally, liquid metal structures disclosed herein, such as conductors, may be formed prior to application of an encapsulation material, or may be formed after application of encapsulation material by filling channels in the encapsulation material with liquid metal.

Modifications are possible in the described embodiments, and other embodiments are possible, within the scope of the claims.

What is claimed is:
1. A semiconductor package, comprising:
a lead frame;
a semiconductor device affixed to the lead frame;
a liquid metal conductor that couples the semiconductor device to the lead frame;
an encapsulation material that encases the semiconductor device, the liquid metal conductor, and at least a portion of the lead frame; and
a liquid metal heat sink configured to transfer heat from the semiconductor device to the lead frame.

2. The semiconductor package of claim 1, wherein the liquid metal conductor comprises a eutectic alloy of gallium and indium.

3. A semiconductor package, comprising:
a lead frame;
a semiconductor device affixed to the lead frame;
a first liquid metal conductor that couples the semiconductor device to the lead frame;
an encapsulation material that encases the semiconductor device, the first liquid metal conductor, and at least a portion of the lead frame; and
a second liquid metal conductor that is: electrically connected to the lead frame and electrically isolated from the semiconductor device; or electrically connected to the semiconductor device and electrically isolated from the lead frame.

4. A semiconductor package, comprising:
a lead frame;
a semiconductor device affixed to the lead frame;
a liquid metal conductor that couples the semiconductor device to the lead frame, wherein the liquid metal conductor is helical in shape; and
an encapsulation material that encases the semiconductor device, the liquid metal conductor, and at least a portion of the lead frame.

5. The semiconductor package of claim 1, wherein a diameter of the liquid metal conductor varies over a length of the liquid metal conductor.

6. A semiconductor package, comprising:
a lead frame;
a first semiconductor device affixed to the lead frame;
a first liquid metal conductor that couples the first semiconductor device to the lead frame;
an encapsulation material that encases the first semiconductor device, the first liquid metal conductor, and at least a portion of the lead frame;
a second semiconductor device; and
a second liquid metal conductor that couples the first semiconductor device to the second semiconductor device.

7. A semiconductor package, comprising:
a lead frame;
a semiconductor device affixed to the lead frame;
a liquid metal conductor that couples the semiconductor device to the lead frame, the liquid metal conductor comprising branches that connect the liquid metal conductor to respective different electrical contacts of: the semiconductor device; or the lead frame; and an encapsulation material that encases the semiconductor device, the liquid metal conductor, and at least a portion of the lead frame.

8. A semiconductor package, comprising:
a lead frame;
a semiconductor device affixed to the lead frame by a layer of liquid metal sandwiched between the semiconductor device and the lead frame;
a liquid metal conductor that couples the semiconductor device to the lead frame; and
an encapsulation material that encases the semiconductor device, the liquid metal conductor, and at least a portion of the lead frame.

9. A semiconductor package, comprising:
a lead frame;
a semiconductor device affixed to the lead frame;
a liquid metal conductor that couples the semiconductor device to the lead frame, wherein the liquid metal conductor is a liquid metal bump; and
an encapsulation material that encases the semiconductor device, the liquid metal conductor, and at least a portion of the lead frame.

10. A method, comprising:
forming a conductor between a semiconductor device and a lead frame by at least:
dispensing a first portion of liquid metal that forms an electrically conductive connection with a conductive terminal of the semiconductor device;
dispensing a second portion of liquid metal that forms an electrically conductive connection with a conductive terminal of a lead frame; and
dispensing a third portion of liquid metal that forms a conductive track that is connected to the first portion of the liquid metal and to the second portion of the liquid metal; and
encasing the semiconductor device, the conductor, and at least a portion of the lead frame in an encapsulation material.

11. The method of claim 10, further comprising affixing the semiconductor device to the lead frame by a layer of liquid metal prior to dispensing the first portion of the liquid metal.

12. The method of claim 10, dispensing liquid metal to form a liquid metal interconnect that couples the semiconductor device to a different semiconductor device affixed to the lead frame.

13. The method of claim 10, further comprising depositing liquid metal to form a liquid metal heat sink that thermally couples the semiconductor device to the lead frame.

14. The method of claim 10, wherein:
dispensing the first portion of the liquid metal comprises positioning a dispensing nozzle to dispense the liquid metal onto the conductive terminal of the semiconductor device;
dispensing the third portion of the liquid metal comprises moving a dispensing nozzle along a path aligned to the track, and dispensing liquid metal from the nozzle during the moving; and
dispensing the second portion of the liquid metal comprises positioning a dispensing nozzle to dispense the liquid metal onto the conductive terminal of the conductive terminal of the lead frame.

15. The method of claim 10, further comprising rupturing an oxide layer surrounding the liquid metal while dispensing the liquid metal onto the conductive terminal of the semiconductor device or the conductive terminal of the lead frame.

16. The method of claim 10, further comprising applying a cleaning agent or flux to the liquid metal prior to dispensing the liquid metal onto the conductive terminal of the semiconductor device or the conductive terminal of the lead frame.

17. The method of claim 10, further comprising dispensing liquid metal to form a conductive element that is: electrically connected to the lead frame and electrically isolated from the semiconductor device; or electrically connected to the semiconductor device and electrically isolated from the lead frame.

18. A semiconductor package, comprising:
a lead frame;
a semiconductor device affixed to the lead frame;
a liquid metal heat sink coupled to the lead frame and the semiconductor device, and configured to transfer heat from the semiconductor device to the lead frame; and
an encapsulation material encasing the semiconductor device, the liquid metal heat sink, and at least a portion of the lead frame.

19. The semiconductor package of the claim 18, further comprising:
a liquid metal conductor that couples the semiconductor device to the lead frame.

20. The semiconductor package of claim 18, further comprising a liquid metal conductor that is: electrically connected to the lead frame and electrically isolated from the semiconductor device; or electrically connected to the semiconductor device and electrically isolated from the lead frame.

* * * * *